US008384423B2

(12) United States Patent
Nguyen et al.

(10) Patent No.: US 8,384,423 B2
(45) Date of Patent: Feb. 26, 2013

(54) REFERENCE VOLTAGE AND IMPEDANCE CALIBRATION IN A MULTI-MODE INTERFACE

(75) Inventors: Huy M. Nguyen, San Jose, CA (US); Vijay Gadde, Cupertino, CA (US); Bret G. Stott, Menlo Park, CA (US)

(73) Assignee: Rambus Inc., Sunnyvale, CA (US)

( * ) Notice: Subject to any disclaimer, the term of this patent is extended or adjusted under 35 U.S.C. 154(b) by 218 days.

(21) Appl. No.: 12/668,344

(22) PCT Filed: May 20, 2008

(86) PCT No.: PCT/US2008/064247
§ 371 (c)(1),
(2), (4) Date: Jan. 8, 2010

(87) PCT Pub. No.: WO2009/014796
PCT Pub. Date: Jan. 29, 2009

(65) Prior Publication Data
US 2010/0202227 A1    Aug. 12, 2010

Related U.S. Application Data

(60) Provisional application No. 60/950,762, filed on Jul. 19, 2007.

(51) Int. Cl.
*H03K 17/16* (2006.01)
(52) U.S. Cl. .......................................... 326/30; 326/83

(58) Field of Classification Search .................. None
See application file for complete search history.

(56) References Cited

U.S. PATENT DOCUMENTS

| 6,483,758 | B1 | 11/2002 | Kim | |
|---|---|---|---|---|
| 7,557,603 | B2 * | 7/2009 | Pan | ................. 326/30 |
| 7,888,962 | B1 * | 2/2011 | Om | ................. 326/30 |
| 2003/0033107 | A1 | 2/2003 | Lee | |
| 2004/0090239 | A1 * | 5/2004 | Ikeoku et al. | ................. 326/30 |
| 2005/0226080 | A1 | 10/2005 | Lee | |
| 2007/0139071 | A1 * | 6/2007 | Nguyen | ................. 326/30 |
| 2008/0031166 | A1 * | 2/2008 | Fukuda | ................. 370/297 |

\* cited by examiner

*Primary Examiner* — Shawki S. Ismail
*Assistant Examiner* — Crystal L Hammond

(57) ABSTRACT

A memory controller includes a transmit circuit coupled to an output node and a receive circuit coupled to an input node. The transmit circuit transmits first data to a memory device through the output node and the receive circuit is configured to receive second data from the memory device through the input node. The memory controller includes a calibration circuit and control logic coupled to the calibration circuit, where the calibration circuit and the control logic are configured to select a first reference voltage and a driver impedance for the transmit circuit and are configured to select a second reference voltage and a termination impedance for the receive circuit. The first reference voltage, the second reference voltage, the driver impedance and the termination impedance are selected from a set of pre-determined values, which are associated with different signaling modes for communication of the first data and the second data.

29 Claims, 5 Drawing Sheets

⎯ 300

```
┌─────────────────────────────────────────────────────────────────────┐
│  SELECT A FIRST DRIVER IMPEDANCE FOR A FIRST DRIVER COUPLED TO AN   │
│  INPUT NODE SO THAT THE INPUT NODE IS APPROXIMATELY AT A REFERENCE  │
│  VOLTAGE, WHERE THE INPUT NODE IS COUPLED TO A THEVENIN EQUIVALENT  │
│      CIRCUIT, AND WHERE THE THEVENIN EQUIVALENT CIRCUIT IS          │
│           CHARACTERIZED BY AN IMPEDANCE AND A VOLTAGE               │
│                                310                                  │
└─────────────────────────────────────────────────────────────────────┘
                                  │
                                  ▼
┌─────────────────────────────────────────────────────────────────────┐
│   SET A SECOND DRIVER IMPEDANCE FOR A SECOND DRIVER, WHERE THE      │
│  SECOND DRIVER IMPEDANCE APPROXIMATELY EQUALS THE FIRST DRIVER      │
│                             IMPEDANCE                               │
│                                312                                  │
└─────────────────────────────────────────────────────────────────────┘
                                  │
                                  ▼
┌─────────────────────────────────────────────────────────────────────┐
│   SELECT A THIRD DRIVER IMPEDANCE FOR A THIRD DRIVER SO THAT AN     │
│   INTERNAL NODE BETWEEN THE SECOND DRIVER AND THE FIRST DRIVER IS   │
│  APPROXIMATELY AT THE REFERENCE VOLTAGE, WHERE THE SECOND DRIVER    │
│      AND THE THIRD DRIVER ARE A COMPLEMENTARY PAIR OF DRIVERS       │
│                                314                                  │
└─────────────────────────────────────────────────────────────────────┘
```

FIG. 3

REFERENCE VOLTAGE AND IMPEDANCE CALIBRATION IN A MULTI-MODE INTERFACE

FIELD

The present embodiments relate to the design of memory systems. More specifically, the present embodiments relate to circuits and methods for selecting a reference voltage, driver impedance, and/or termination impedance in an interface within a memory system that supports different signaling modes for communication.

BACKGROUND

A variety of signaling modes can be used on communication links in memory systems. For example, advances in integrated-circuit technology for memory system components have led to changes in voltages and impedances on communication links between these memory system components. Unfortunately, providing a family of components, each of which supports a different one of these signaling modes for communication, is expensive and increases inventory requirements.

Moreover, it is often difficult to upgrade or change a particular combination of components in a memory system if the change involves modifying the signaling mode for communication between memory system components. This is because different signaling modes often have different common-mode voltages. These common-mode voltage differences may cause significant errors when attempting to determine driver and/or termination impedances in interface circuits that are associated with different signaling modes for communication.

Hence, what is needed are circuits and techniques which facilitate the use of different signaling modes in memory systems without the problems listed above.

BRIEF DESCRIPTION OF THE FIGURES

FIG. 3 is a flow chart illustrating an embodiment of a process for configuring an interface.

Figure 1A:
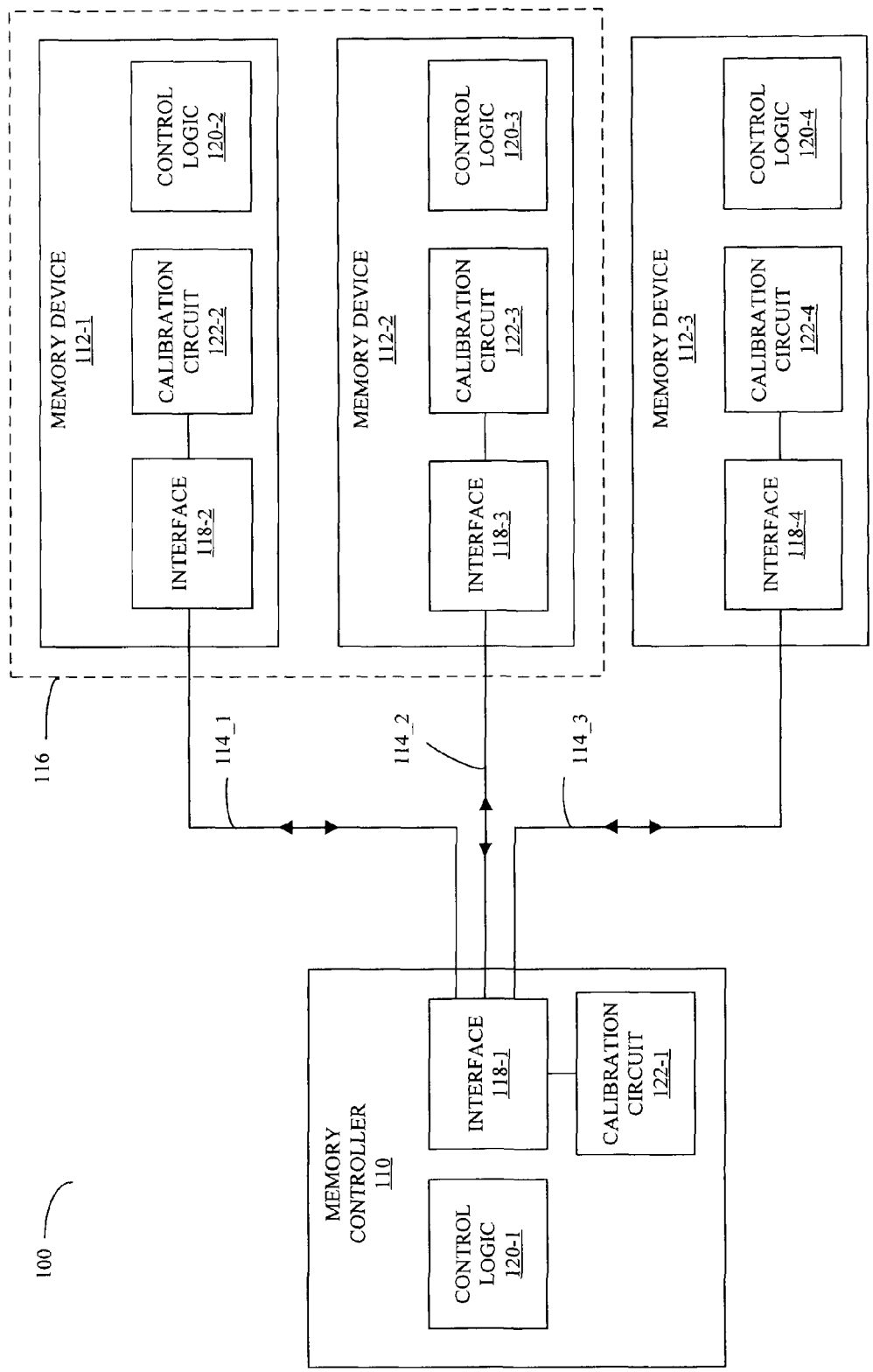
FIG. 1A is a block diagram illustrating an embodiment of a memory system.

Table 1 provides impedances and common-mode voltages associated with several signaling modes for communication.

Note that like reference numerals refer to corresponding parts throughout the drawings.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

Embodiments of a circuit, a memory controller, a memory device, a system that includes the memory controller and the memory device, and a technique for configuring an interface are described. This memory controller includes a transmit circuit coupled to an output node and a receive circuit coupled to an input node, wherein the transmit circuit is configured to transmit first data to a memory device through the output node and the receive circuit is configured to receive second data from the memory device through the input node. Moreover, the memory controller includes a calibration circuit and control logic coupled to the calibration circuit, where the calibration circuit and the control logic are configured to select a first reference voltage and a driver impedance for the transmit circuit and are configured to select a second reference voltage and a termination impedance for the receive circuit. Note that the first reference voltage, the second reference voltage, the driver impedance and the termination impedance are selected from a set of pre-determined values, and the set of pre-determined values are associated with different signaling modes for communication for the first data and the second data.

In some embodiments, the first reference voltage and the second reference voltage are common-mode voltages. Moreover, in some embodiments the first reference voltage and the second reference voltage are different voltages.

In some embodiments, the selection is based on the third reference voltage. For example, the third reference voltage may be associated with a Thevenin equivalent circuit which is coupled to another input node of the memory controller, where the Thevenin equivalent circuit is characterized by an impedance and a voltage.

In some embodiments, the selection takes place during a calibration mode of operation. For example, the calibration may be performed once, periodically and/or after an elapsed time interval.

In some embodiments, the selection occurs continuously.

In some embodiments, the selection occurs during transmission of the first data or reception of the second data.

In some embodiments, the memory controller includes a register to store a value associated with the driver impedance and/or to store a value associated with the termination impedance.

In some embodiments, the calibration circuit includes a comparator coupled to the third reference voltage and selectively coupled to pre-determined voltages by a switching mechanism. Moreover, the control logic configures the switching mechanism, based on an output from the comparator, to select the first reference voltage and the second reference voltage from the pre-determined voltages. In some embodiments, the memory controller includes another input node to receive the pre-determined voltages and/or a voltage generator to generate the pre-determined voltages.

In some embodiments, the set of pre-determined values are associated with different types of memory technology. For example, the different types of memory technology may use different power supply voltages. Moreover, in some embodiments the different types of memory technology include a stub series-termination logic (SSTL) driver and/or a pseudo open drain (PSOD) driver.

In some embodiments, during the selection the control logic configures the switching mechanism to selectively couple voltages associated with a driver and/or an on-die termination (ODT) to the comparator and to selectively couple the third reference voltage to the comparator. Moreover, the control logic selects the driver impedance and/or the ODT impedance based one or more outputs from the comparator.

In some embodiments, the first data is transmitted using voltage-mode signaling by a driver having the driver impedance, and the second data is received using a parallel ODT having the termination impedance.

In some embodiments, the memory controller includes a first driver and a second driver, wherein the first driver and the second driver are a complementary pair of drivers. Moreover, the driver impedance includes a first impedance associated with the first driver and a second impedance associated with the second driver.

In some embodiments, the memory controller includes a first ODT and a second ODT, wherein the first ODT and the second ODT are a complementary pair of ODTs. Moreover, the termination impedance includes a first termination impedance associated with the first ODT and a second termination impedance associated with the second ODT.

In some embodiments, the driver impedance includes a first ratio of an impedance for a pull-up driver to an impedance for a pull-down driver and/or the termination impedance includes a second ratio of an impedance for a pull-up transistor to an impedance for a pull-down transistor.

Another embodiment provides a first circuit that includes at least some of the components in the memory controller.

Another embodiment provides the memory device. This memory device includes another transmit circuit coupled to another output node and another receive circuit coupled to yet another input node, wherein the other transmit circuit is configured to transmit third data to the memory controller through the other output node and the other receive circuit is configured to receive fourth data from the memory controller through the yet another input node. Moreover, the memory device includes another calibration circuit and additional control logic coupled to the other calibration circuit, where the other calibration circuit and the additional control logic are configured to select a fourth reference voltage and another driver impedance for the other transmit circuit and are configured to select a fifth reference voltage and another termination impedance for the other receive circuit. Note that the fourth reference voltage, the fifth reference voltage, the other driver impedance and the other termination impedance are selected from another set of pre-determined values, and the other set of pre-determined values are associated with different signaling modes for communication of the third data and the fourth data.

Another embodiment provides a second circuit that includes at least some of the components in the memory device.

Another embodiment provides the system that includes the memory controller and the memory device coupled to the memory controller. Moreover, in some embodiments the system is implemented on a chip package that includes an integrated circuit with the memory controller and the memory device or separate integrated circuits with, respectively, the memory controller and the memory device.

Another embodiment provides a computer-readable medium that includes data that specifies the first circuit, the second circuit, the memory controller, the memory device, and/or the system.

Another embodiment provides a method for configuring an interface, which may be performed by a device (such as the first circuit and/or the second circuit). During operation, the device selects a first driver impedance for a first driver coupled to an input node so that the input node is approximately at a reference voltage. Note that the input node is coupled to a Thevenin equivalent circuit, and the Thevenin equivalent circuit is characterized by an impedance and a voltage. Next, the device sets a second driver impedance for a second driver, where the second driver impedance approximately equals the first driver impedance. Then, the device selects a third driver impedance for a third driver so that an internal node between the second driver and the first driver is approximately at the reference voltage, where the second driver and the third driver are a complementary pair of drivers.

Embodiments of one or more of these circuits, integrated circuits, systems and/or techniques may be used in different types of memory, including: volatile memory, non-volatile memory, dynamic random access memory (DRAM), static random access memory (SRAM), read-only memory (ROM), erasable programmable read-only memory (EPROM), electrically erasable programmable read-only memory (EEPROM), Flash, solid-state memory, and/or another type of memory. Moreover, for a given type of memory, these techniques may be used in different memory technologies or technology generations (which may use different power supply voltages). For example, these techniques may be used in dual-data rate (DDR), graphics dual-data rate (GDDR) and/or synchronous DRAM, such as: DDR2, DDR3, DDRx, GDDR1, GDDR3, GDDR5, Mobile DDR, and/or Fully Buffered DIMM.

Consequently, memory components (such as the memory controller, the memory device, a memory module, and/or a memory system) that use these techniques may be included in a wide variety of applications, such as: desktop or laptop computers, computer systems, hand-held or portable devices (such as personal digital assistants and/or cellular telephones), set-top boxes, home networks, and/or video-game devices. For example, a storage device (such as the memory module) may be included in computer main memory. Moreover, one or more of these embodiments may be included in a communication channel, such as: serial or parallel wireless links, wireless metropolitan area networks (such as WiMax), wireless local area networks (WLANs), and/or wireless personal area networks (WPANs).

We now describe embodiments of circuits, devices and systems to configure an interface. FIG. 1A presents a block diagram illustrating an embodiment of a memory system 100. This memory system includes at least one memory controller 110 and one or more memory devices 112, such as one or more memory modules. While FIG. 1 illustrates memory system 100 having one memory controller 110 and three memory devices 112, other embodiments may have additional memory controllers and fewer or more memory devices 112. Moreover, while memory system 100 illustrates memory controller 110 coupled to multiple memory devices 112, in other embodiments two or more memory controllers may be coupled to one another. Note that memory controller 110 and one or more of the memory devices 112 may be implemented on the same or different integrated circuits, and that these one or more integrated circuits may be included in a chip-package.

In some embodiments, the memory controller 110 is a local memory controller (such as a DRAM memory controller) and/or is a system memory controller (which may be implemented in a microprocessor).

Memory controller 110 may include an I/O interface 118-1, calibration circuit 122-1 and control logic 120-1. As discussed further below with reference to FIG. 2, control logic 120-1 and calibration circuit 122-1 may be used to select a first reference voltage and a driver impedance for one or more transmit circuits in the interface 118-1 and/or a second reference voltage and a termination impedance for one or more receive circuits in the interface 118-1. These reference voltages, the driver impedance and/or the termination impedance may be selected from a set of pre-determined values that are associated with different signaling modes for communication, which may be used to communicate data and/or commands between the memory controller 110 and one or more of the memory devices 112.

In some embodiments, one or more of memory devices 112 optionally include control logic 120, at least one of interfaces 118 and at least one of calibration circuits 122. However, in some embodiments some of the memory devices 112 may not have control logic 120, one of the interfaces 118 and/or one of the calibration circuits 122. Moreover, memory controller 110 and/or one or more of memory devices 112 may include more than one of the interfaces 118, and these interfaces may share one or more control logic 120 circuits and/or one or more of the calibration circuits 122. Note that in embodiments two or more of the memory devices 112, such as memory devices 112-1 and 112-2, may be configured as a memory bank 116.

Memory controller 110 and memory devices 112 are coupled by one or more links 114. While memory system 100 illustrates three links 114, other embodiments may have fewer or more links 114. These links may include: wired, optical and/or wireless communication. Furthermore, links 114 may be used for bi-directional and/or uni-directional communications between the memory controller 110 and one or more of the memory devices 112. For example, bi-directional communication between the memory controller 110 and a given memory device may be simultaneous (full-duplex communication). Alternatively, the memory controller 110 may transmit information (such as a data packet which includes a command) to the given memory device, and the given memory device may subsequently provide requested data to the memory controller 110, i.e., a communication direction on one or more of the links 114 may alternate (half-duplex communication). Note that one or more of the links 114 and corresponding transmit circuits and/or receive circuits may be dynamically configured, for example, by one of the control logic 120 circuits, for bi-directional and/or unidirectional communication.

Signals corresponding to data and/or commands may be communicated on one or more of the links 114 using either or both edges in one or more timing signals. These timing signals may be generated based on one or more clock signals, which may be generated on-chip (for example, using a phase-locked loop and one or more reference signals provided by a frequency reference) and/or off-chip. Moreover, in some embodiments, transmitting and receiving of these signals may be synchronous and/or asynchronous.

Moreover, data may be communicated on one or more of the links 114 using one or more sub-channels associated with one or more carrier frequencies $f_i$. Moreover, a given sub-channel may have an associated: range of frequencies, a frequency band, or groups of frequency bands (henceforth referred to as a frequency band). For example, a baseband sub-channel is associated with a first frequency band and a passband sub-channel is associated with a second frequency band. Note that, if at least one of the links 114 is AC-coupled, the baseband sub-channel may not contain DC (i.e., does not include 0 Hz).

In some embodiments, frequency bands for adjacent sub-channels may partially or completely overlap, or may not overlap. For example, there may be partial overlap of neighboring frequency bands, which occurs in so-called approximate bit loading. Moreover, in some embodiments signals on adjacent sub-channels may be orthogonal.

Signals carried on these sub-channels may be time-multiplexed, frequency multiplexed, and/or encoded. Thus, in some embodiments the signals are encoded using: time division multiple access, frequency division multiple access and/or code division multiple access. Moreover, in some embodiments signals are communicated on the links 114 using discrete multi-tone communication (such as Orthogonal Frequency Division Multiplexing).

Note that encoding should be understood to include modulation coding and/or spread-spectrum encoding, for example, coding based on binary pseudorandom sequences (such as maximal length sequences or m-sequences), Gold codes and/or Kasami sequences. Furthermore, modulation coding may include bit-to-symbol coding in which one or more data bits are mapped together to a data symbol, and symbol-to-bit coding in which one or more symbols are mapped to data bits. For example, a group of two data bits can be mapped to: one of four different amplitudes of an encoded data signal; one of four different phases of a sinusoid; or a combination of one of two different amplitudes of a sinusoid and one of two different phases of the same sinusoid (such as in quadrature amplitude modulation or QAM).

In general, the modulation coding may include: amplitude modulation, phase modulation and/or frequency modulation, such as pulse amplitude modulation (PAM), pulse width modulation and/or pulse code modulation. For example, the modulation coding may include: two-level pulse amplitude modulation (2-PAM), four-level pulse amplitude modulation (4-PAM), eight-level pulse amplitude modulation (8-PAM), sixteen-level pulse amplitude modulation (16-PAM), two-level on-off keying (2-OOK), four-level on-off keying (4-OOK), eight-level on-off keying (8-OOK), and/or sixteen-level on-off keying (16-OOK).

In some embodiments, the modulation coding includes non-return-to-zero (NRZ) coding. Moreover, in some embodiments the modulation coding includes two-or-more-level QAM. Note that the different sub-channels communicated on the links 114 may be encoded differently and/or the modulation coding may be dynamically adjusted, for example, based on a performance metric associated with communication on one or more of the links 114. This performance metric may include: a signal strength (such as a signal amplitude or a signal intensity), a mean square error (MSE) relative to a target (such as a detection threshold, a point in a constellation diagram, and/or a sequence of points in a constellation diagram), a signal-to-noise ratio (SNR), a bit-error rate (BER), a timing margin, and/or a voltage margin.

In some embodiments, commands are communicated from the memory controller 110 to one or more of the memory devices 112 using a separate command link, i.e., using a subset of the links 114 which communicate commands. This separate command link may be wireless, optical and/or wired. However, in some embodiments commands are communicated using the same channel (i.e., the same links 114) as data. Moreover, communication of commands: may have a lower data rate than the data rates associated with communication of data between the memory controller 110 and one or more of the memory devices 112; may use different carrier frequencies than are used to communicate data; and/or may use a different modulation technique than is used to communicate data.

Note that in some embodiments the memory controller 110 and/or one or more of the memory device 112 may use additional techniques to recover or prevent the loss of data communicated between components in the memory system 100 and/or the loss of stored data. For example, at least a portion of the data communicated between the components and/or the stored data may include error-detection-code (EDC) information and/or error-correction-code (ECC) information. This EDC and/or ECC information may be pre-existing or may be dynamically generated (i.e., in real time).

In some embodiments, the ECC information includes a Bose-Chaudhuri-Hochquenghem (BCH) code. Note that BCH codes are a sub-class of cyclic codes. In exemplary embodiments, the ECC information includes: a cyclic redundancy code (CRC), a parity code, a Hamming code, a Reed-Solomon code, and/or another error checking and correction code.

Consequently, in some embodiments the receive circuits implement error detection and/or correction. For example, errors associated with communication may be detected by performing a multi-bit XOR operation in conjunction with one or more parity bits in the signals.

Moreover, control logic 120 in the memory controller 110 and/or one or more of the memory device 112 may take a variety of remedial actions in the event of an error or a degradation of one or more of the performance metrics during communication between the memory controller 110 and one or more of the memory devices 112. These remedial actions may include: re-transmitting previous data; transmitting previous or new data (henceforth referred to as data) using an increased transmission power than the transmission power used in a previous transmission; reducing the data rate in one or more of the sub-channels relative to the data rate used in a previous transmission; transmitting data with reduced intersymbol interference (for example, with blank intervals inserted before and/or after the data); adjusting a period of the one or more timing signals; adjusting a skew or delay of the one or more timing signals; transmitting data at a single clock edge (as opposed to dual-data-rate transmission); transmitting data with at least a portion of the data including ECC or EDC; transmitting data using a different encoding or modulation code than the encoding used in a previous transmission; transmitting data after a pre-determined idle time; transmitting data to a different receive circuit; transmitting data to another device (which may attempt to forward the data); and/or changing the number of sub-channels. Note that in some embodiments one or more of these adjustments are performed: continuously; as need based (for example, based on one or more of the performance metrics); and/or after a pre-determined time interval.

In some embodiments, the remedial action (and more generally adjustments to one or more of the sub-channels) is based on control information that is exchanged between the memory controller 110 and one or more of the memory devices 112. This control information may be exchanged using in-band communication (i.e., via the frequency bands used to communicate the signals corresponding to the data) and/or out-of-band communication (for example, using the separate link).

In some embodiments, the remedial action and/or adjustments involve an auto-negotiation technique. During this auto-negotiation technique, a receive circuit in one of the components (such as the memory controller 110) may provide feedback to a transmit circuit in another component (such as memory device 112-1) on the efficacy of any changes to the signals on a given sub-channel. Based on this feedback, the transmit circuit may further modify these signals, i.e., may perform the remedial action.

Figure 1B:
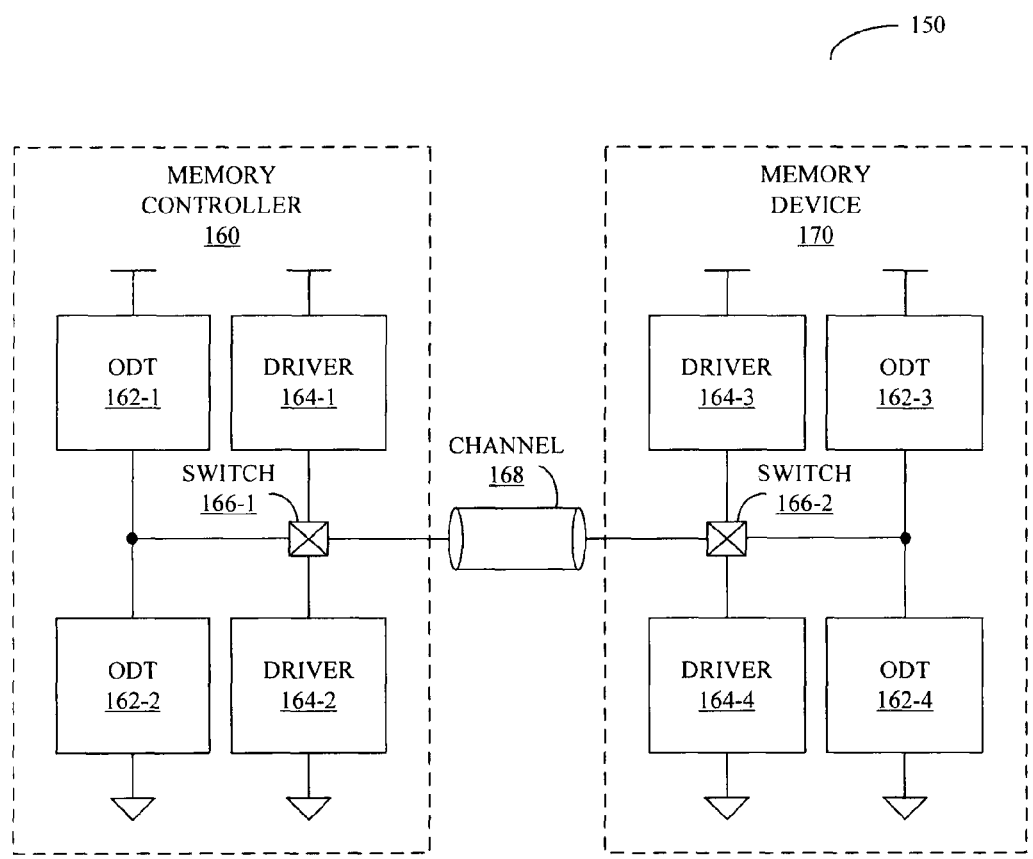
FIG. 1B is a block diagram illustrating an embodiment of a memory system.

FIG. 1B presents a block diagram illustrating an embodiment of a memory system 150. This memory system includes a memory controller 160 coupled to a memory device 170 by a channel 168, which may include one or more links. In an exemplary embodiment, the channel 168 is configured for half-duplex bi-directional communication.

Memory controller 160 and memory device 170 each include interfaces with one or more transmit and receive circuits. These transmit circuits may include pairs of complementary drivers 164 (e.g., driver 164-1 may be p-type or pull-up and driver 164-2 may be n-type or pull-down) and the receive circuits may include on-die termination (ODT) 162. For example, ODT 162 impedances, such as ODT 162-1 and ODT 162-2, may be arranged in parallel. In some embodiments, ODT is implemented using pairs of complementary transistors or arrays of transistors.

During half-duplex operation, switches 166 selectively couple the drivers 164 and the ODT 162 to the channel 168. For example, when transmitting data to the memory device 170, switch 166-1 couples drivers 164-1 and 164-2 to the channel 168 and decouples ODT 162-1 and ODT 162-2 from the channel 168. Similarly, when receiving data from the memory controller 160, switch 166-2 decouples drivers 164-3 and 164-4 from the channel 168 and couples ODT 162-3 and ODT 162-4 to the channel 168.

As noted previously, these interfaces may be configurable to communicate data and/or commands using different signaling modes for communication. However, it can be difficult to adjust or calibrate the impedance for the drivers 164 and/or the ODT 162 impedances for a given signaling mode of communication because these different signaling modes for communication may have different common-mode voltages. In particular, different common-mode voltages can cause errors when calibrating driver impedances and/or termination impedances. For example, if the impedances are calibrated at common-mode voltage of $0.5V_{DDIO}$ and subsequent communication occurs using a common-mode voltage of $0.75V_{DDIO}$, there will be an impedance error of 7.5%. Similarly, if the impedances are calibrated at a common-mode voltage of $0.75V_{DDIO}$ and subsequent communication occurs using a common-mode voltage of $0.5V_{DDIO}$, the impedance error will be 9%.

Figure 2:
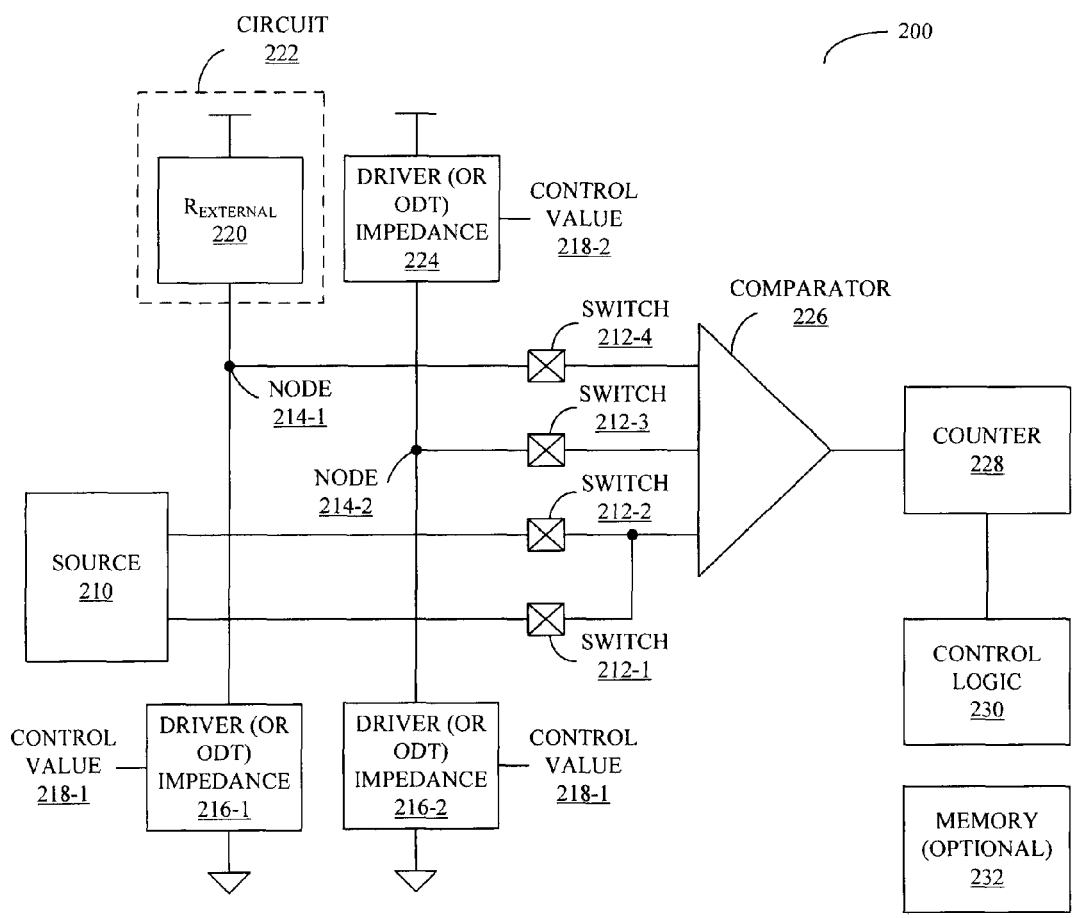
FIG. 2 is a block diagram illustrating an embodiment of a calibration circuit.

This problem may be reduced or eliminated using an embodiment of a calibration circuit, such as calibration circuit 200 illustrated in FIG. 2. In particular, this calibration circuit may support multiple signaling modes for communication, such as different voltage signaling modes, by configuring the common-mode voltage and the impedances to those associated with a selected signaling mode. As described further below, in some embodiments a given signaling mode of communication is selected by coupling an appropriate external resistor and/or voltage to a node, such as node 214-1, in the calibration circuit 200.

In some embodiments, the selection takes place during a calibration mode of operation. For example, the calibration may be performed once, periodically and/or after an elapsed time interval. However, in some embodiments the selection occurs continuously. Moreover, in some embodiments, the selection occurs during transmission of data (or commands) or during reception of data (or commands).

Note that the calibration may include one or more driver impedances in one device (such as those associated with drivers 164-1 and 164-2 in FIG. 1B) and/or one or more ODT impedances in another device (such as ODT 162-3 and 162-4 in FIG. 1B). Alternatively, in some embodiments a device self-calibrates the driver impedances and/or the ODT impedances. Thus, calibration circuit 200 may be used to calibrate driver impedances and/or ODT impedances.

During calibration of driver impedance and/or ODT impedance, the common-mode voltage and a ratio of driver (or ODT) impedance 224 to driver (or ODT) impedance 216-1 and/or 216-2 may be determined. In some embodiments, the impedances are associated with a complementary pair of drivers or ODTs. For example, driver (or ODT) impedance 224 may be p-type or pull-up and driver (or ODT) impedance 216-1 and/or 216-2 may be n-type or pull-down. However, in other embodiments driver (or ODT) impedance 224 may be n-type and driver (or ODT) impedance 216-2 may be p-type.

Moreover, a given driver (or ODT) impedance may be associated with a group of transistors that are binary encoded or analog encoded, so that a given impedance value may be obtained based on a control value applied to the group. For example, the transistors in the group may be binary weighted. In some embodiments, the transistors in the group are thermometer encoded.

In some embodiments, during calibration, a common-mode voltage or reference voltage output by source 210 (such as a voltage generator) is selected. For example, source 210 may output two or more reference voltages (i.e., a set of pre-determined voltages) that are associated with different signaling modes for communication, and a given reference voltage may be selected by control logic 230 by selectively closing switch 212-1 or switch 212-2, thereby coupling the given reference voltage to comparator 226. Alternatively, the reference voltages may be received from an external source which is coupled to the calibration circuit 200. In an exemplary embodiment, the source 210 outputs $0.5V_{DDIO}$ and $0.75V_{DDIO}$. In the following discussion, $0.5V_{DDIO}$ is used as an illustrative example. This reference voltage is selected by closing switch 212-1 and opening switch 212-2.

Next, control logic 230 may set or adjust control value 218-1, which is applied to a group of drivers (or ODTs) to select driver (or ODT) impedance 216-1. In particular, control value 218-1 is chosen so that node 214-1 in the potential divider formed by driver (or ODT) impedance 216-1 and circuit 222 is at the reference voltage (i.e., $0.5V_{DDIO}$). This may be determined by selectively coupling node 214-1 to comparator 226 using switch 212-4 and coupling an output from comparator 226 to a counter 228 such as an Up/Down counter.

In some embodiments, circuit 222 is a Thevenin equivalent circuit characterized by a voltage (such as $V_{DDIO}$) and a resistance (or more generally, an impedance). In an exemplary embodiment, the resistance is that of an external resistor ($R_{external}$) 220 coupled to node 214-1 in the calibration circuit 200. Note that when the reference voltage is $0.5V_{DDIO}$ the ratio of $R_{external}$ 220 to driver (or ODT) impedance 216-1 is 1. Similarly, when the reference voltage is $0.75V_{DDIO}$ the ratio of $R_{external}$ 220 to driver (or ODT) impedance 216-1 is 1/3. As described below, these ratios also apply to driver (or ODT) impedance 224 and driver (or ODT) impedance 216-2. More generally, the ratio of the pull-up to the pull-down impedances may be set or adjusted to obtain a desired common-mode voltage.

Then, control value 218-1 is applied to another group of drivers (or ODTs) to select driver (or ODT) impedance 216-2, and switch 212-4 is opened and switch 212-3 is closed, thereby coupling node 214-2 to comparator 226. Based on the output from the comparator 226, control logic 230 may set or adjust control value 218-2, which is applied to a group of drivers (or ODTs) to select driver (or ODT) impedance 224. In particular, control value 218-2 is chosen so that node 214-2 in the potential divider formed by driver (or ODT) impedance 216-2 and driver (or ODT) impedance 224 is at the reference voltage (i.e., $0.5V_{DDIO}$)

In some embodiments, calibration circuit 200 includes optional memory 232 (such as a register) to store control value 218-1 and/or control value 218-2.

As noted previously, calibration circuit 200 may be used to calibrate impedances for drivers and/or ODTs at the appropriate common-mode voltage associated with a given signaling mode of communication. Note that for the given signaling mode, the reference voltage or common-mode voltage used when calibrating a driver may be the same or different from the reference voltage or common-mode voltage used when calibrating an ODT.

In some embodiments, calibration circuit 200 is pre-configured to calibrate drivers and/or ODTs based on reference voltages and impedances associated with two or more different signaling modes for communication. For example, source 210 may output reference voltages associated with these different signaling modes, and drivers and ODTs may be configurable to provide a range of impedances, such as driver (or ODT) impedances 216 and 224, which encompass the impedances associated with these different signaling modes.

In some embodiments, the different signaling modes are associated with different types of memory technology or technology generations, which may use different power supply voltages. In an exemplary embodiment, the different types of memory technology include: SSTL 1.5, SSTL 1.8, SSTL 2.5, and/or SSTL 3.3. Moreover, in some embodiments the different types of memory technology include a stub series-termination logic (SSTL) driver and/or a pseudo open drain (PSOD) driver. In these embodiments, control logic 230 and the calibration circuit 200 may facilitate a change in the signaling mode of communication from SSTL (such as SSTL 1.5) to PSOD, and/or vice versa. Table 1 provides exemplary impedances and common-mode voltages associated with several signaling modes for communication. However, note that the techniques for configuring an interface can support an arbitrary common-mode voltage by using an appropriate ratio of driver and/or ODT impedances 224 and 216-2.

TABLE 1

|  | DDR2 | DDR3 | GDDR3 |
| --- | --- | --- | --- |
| Rexternal (Ω) | 73.2 | 240 | 80 |
| Driver Impedance (Ω) | 18 or 36 | 36 | 40 |
| ODT Impedance (Ω) | 75 or 150 | 60 or 120 | 60 or 120 |
| Common-Mode Voltage (V) | $0.5 V_{DDIO}$ | $0.5 V_{DDIO}$ | $0.75 V_{DDIO}$ |

In an exemplary embodiment, during driver-impedance calibration for GDDR3, while one of switches 212-1 and 212-2 couples $0.75V_{DDIO}$ provided by source 210 to comparator 226 and switch 212-4 couples node 214-1 to comparator 226, control value 218-1 is selected so that driver impedance 216-1 is set to 240Ω. Next, when switch 212-4 is open and switch 212-3 is closed, driver impedance 216-2 is set to 240Ω (using control value 218-1) and control value 218-2 is selected so that driver impedance 224 is set to 80Ω. For example, this may be accomplished by coupling three 240Ω impedances in parallel. Then, having calibrated to the common-mode voltage, the driver impedance of 40Ω may be separately implemented by coupling six of the determined 240Ω impedances in parallel.

In another exemplary embodiment, during ODT-impedance calibration for DDR2, while one of switches 212-1 and 212-2 couples $0.5V_{DDIO}$ provided by source 210 to comparator 226 and switch 212-4 couples node 214-1 to comparator 226, control value 218-1 is selected so that ODT impedance

216-1 is set to 300Ω. Next, when switch 214-4 is open and switch 214-3 is closed, ODT impedance 216-2 is set to 300Ω (using control value 218-1) and control value 218-2 is selected so that driver impedance 224 is set to 300Ω. Then, having calibrated to the common-mode voltage, the driver impedance of 150Ω may be separately implemented by coupling two of the determined 300Ω impedances in parallel.

By calibrating the impedances for an interface at the appropriate reference voltage or common-mode voltage using this technique, calibration circuit 200 may facilitate configuration of memory components. For example, a memory controller may be statically (e.g., one-time) or dynamically configured to communicate with different types of memory and/or with memory devices that include different memory technology (such as different power-supply voltages). In particular, the memory controller and/or the memory device may be configured (with reduced or eliminated impedance errors) to communicate using a given signaling mode of communication in a group of signaling modes (which may have different common-mode voltages). In this way, vendors may leverage circuits and simplify their product family while still supporting a wide variety of signaling modes for communication. Moreover, using the calibration circuit 200 and this technique, memory components and/or systems may be subsequently changed or upgraded.

Note that the memory system 150 (FIG. 1B) and/or calibration circuit 200 may include fewer components or additional components. Moreover, two or more components can be combined into a single component and/or the position of one or more components can be changed.

Components and/or functionality illustrated in memory system 150 and/or calibration circuit 200 may be implemented using analog circuits and/or digital circuits. Furthermore, components and/or functionality in the memory system 150 and/or calibration circuit 200 may be implemented using hardware and/or software. For example, control logic 210 may include a processor or a processor core, and counter 228 may be implemented as instructions that are executed by the processor or the processor core.

We now describe embodiments of a process for configuring an interface. FIG. 3 presents a flow chart illustrating an embodiment of a process 300 for configuring an interface, which may be performed by a device (such as a memory controller and/or a memory device). During operation, the device selects a first driver impedance for a first driver coupled to an input node so that the input node is approximately at a reference voltage (310). Note that the input node is coupled to a Thevenin equivalent circuit, and the Thevenin equivalent circuit is characterized by an impedance and a voltage. Next, the device sets a second driver impedance for a second driver (312), where the second driver impedance approximately equals the first driver impedance. Then, the device selects a third driver impedance for a third driver so that an internal node between the second driver and the first driver is approximately at the reference voltage (314), where the second driver and the third driver are a complementary pair of drivers.

In some embodiments of the process 300 there may be fewer or additional operations. Moreover, two or more operations can be combined into a single operation, and/or a position of one or more operations may be changed.

Devices and circuits described herein may be implemented using computer aided design tools available in the art, and embodied by computer-readable files containing software descriptions of such circuits. These software descriptions may be: at behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level RTL languages like Verilog and VHDL, formats supporting geometry description languages (such as GDSII, GDSIII, GDSIV, CIF, and MEBES), and other suitable formats and languages. Moreover, data transfers of such files on machine-readable media including carrier waves may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 4:
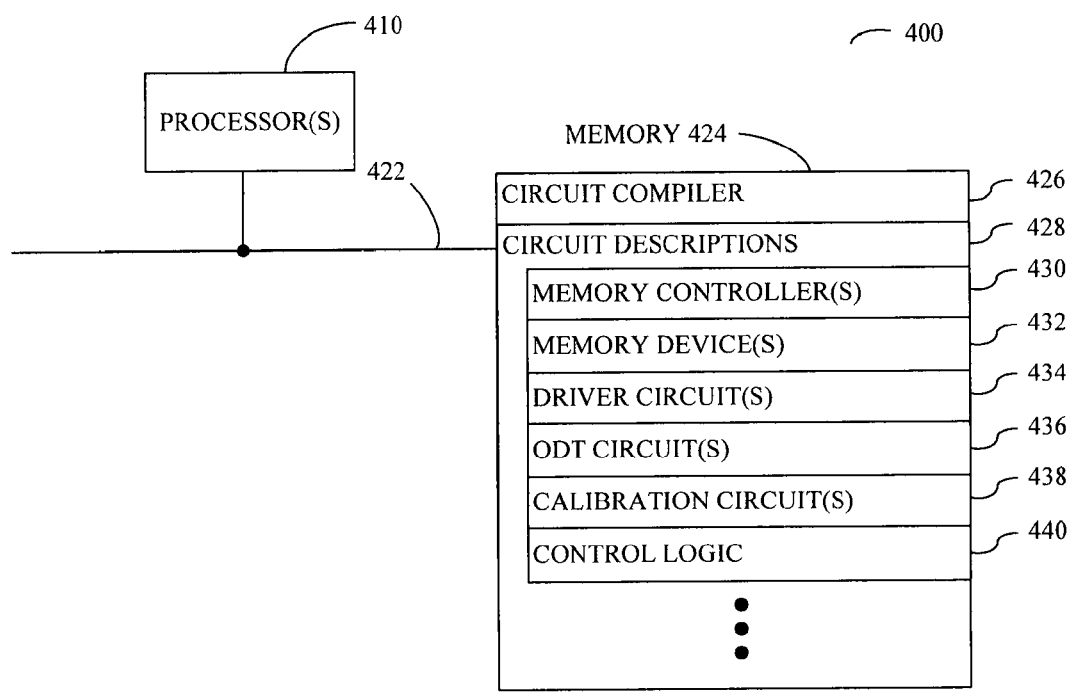
FIG. 4 is a block diagram illustrating an embodiment of a system.

FIG. 4 presents a block diagram illustrating an embodiment of a system 400 that stores such computer-readable files. This system may include at least one data processor or central processing unit (CPU) 410, memory 424 and one or more signal lines or communication busses 422 for coupling these components to one another. Memory 424 may include high-speed random access memory and/or non-volatile memory, such as: ROM, RAM, EPROM, EEPROM, Flash, one or more smart cards, one or more magnetic disc storage devices, and/or one or more optical storage devices.

Memory 424 may store a circuit compiler 426 and circuit descriptions 428. Circuit descriptions 428 may include descriptions of the circuits, or a subset of the circuits discussed above with respect to FIGS. 1-2. In particular, circuit descriptions 428 may include circuit descriptions of: one or more memory controllers 430, one or more memory devices 432, one or more driver circuits 434, one or more ODT circuits 436, one or more calibration circuits 438, and/or control logic 440 (or a set of instructions).

In some embodiments, system 400 includes fewer or additional components. Moreover, two or more components can be combined into a single component, and/or a position of one or more components may be changed.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A memory controller, comprising:
   a transmit circuit coupled to an output node, wherein the transmit circuit is to transmit first data to a memory device through the output node;
   a receive circuit coupled to a first input node, wherein the receive circuit is to receive second data from the memory device through the first input node;
   a calibration circuit;
   control logic coupled to the calibration circuit, wherein the calibration circuit and the control logic are to select a first reference voltage and a driver impedance for the transmit circuit and are to select a second reference voltage and a termination impedance for the receive circuit, wherein the first reference voltage, the second reference voltage, the driver impedance and the termination impedance are selected from a set of pre-determined values, and wherein the set of pre-determined values are associated with different signaling modes for communication of the first data and the second data; and a comparator and a switching mechanism in the calibration circuit, wherein the comparator is coupled to a third reference voltage and selectively coupled to pre-determined voltages by the switching mechanism, and wherein, based on an output from the comparator, the control logic configures the switching mechanism to select the first reference voltage and the second reference voltage from the pre-determined voltages.

2. The memory controller of claim 1, wherein the first reference voltage and the second reference voltage are each common-mode voltages.

3. The memory controller of claim 1, wherein the selection from the pre-determined values is to be based on the third reference voltage, and wherein the third reference voltage is associated with a Thevenin equivalent circuit to be coupled to a second input node, and
wherein the Thevenin equivalent circuit is characterized by an impedance and a voltage.

4. The memory controller of claim 1, wherein the selection from the pre-determined values takes place during a calibration mode of operation.

5. The memory controller of claim 4, wherein calibration associated with the calibration mode of operation is performed once, periodically or after an elapsed time interval.

6. The memory controller of claim 1, wherein the selection from the pre-determined values occurs continuously.

7. The memory controller of claim 1, wherein the selection from the pre-determined values occurs during transmission of the first data or reception of the second data.

8. The memory controller of claim 1, further comprising a register to store a value associated with the driver impedance.

9. The memory controller of claim 1, further comprising a register to store a value associated with the termination impedance.

10. The memory controller of claim 1, wherein the first reference voltage and the second reference voltage are different voltages.

11. The memory controller of claim 1, further comprising a second input node to receive the pre-determined voltages.

12. The memory controller of claim 1, further comprising a voltage generator to generate the pre-determined voltages.

13. The memory controller of claim 1, further comprising a second input node to couple to a Thevenin equivalent circuit, wherein the third reference voltage is associated with the Thevenin equivalent circuit, and
wherein the Thevenin equivalent circuit is characterized by an impedance and a voltage.

14. The memory controller of claim 1, wherein the set of pre-determined values are associated with different types of memory technology.

15. The memory controller of claim 14, wherein the different types of memory technology use different power supply voltages.

16. The memory controller of claim 14, wherein the different types of memory technology include a stub series-termination logic (SSTL) driver or a pseudo open drain (PSOD) driver.

17. The memory controller of claim 1, wherein the first data is to be transmitted using voltage-mode signaling by a driver having the driver impedance, and
wherein the second data is to be received using a parallel on-die termination (ODT) having the termination impedance.

18. The memory controller of claim 1, further comprising a first driver and a second driver, wherein the first driver and the second driver are a complementary pair of drivers, and
wherein the driver impedance includes a first impedance associated with the first driver and a second impedance associated with the second driver.

19. The memory controller of claim 1, further comprising a first on-die termination (ODT) and a second ODT, wherein the first ODT and the second ODT are a complementary pair of ODTs, and
wherein the termination impedance includes a first termination impedance associated with the first ODT and a second termination impedance associated with the second ODT.

20. The memory controller of claim 1, wherein the driver impedance includes a first ratio of an impedance for a pull-up driver to an impedance for a pull-down driver, and wherein the termination impedance includes a second ratio of an impedance for a pull-up transistor to an impedance for a pull-down transistor.

21. A memory controller, comprising:
first means for transmitting first data to a memory device;
second means for receiving second data from the memory device;
a calibration circuit;
control logic coupled to the calibration circuit, wherein the calibration circuit and the control logic are to select a first reference voltage and a driver impedance for the first means and are to select a second reference voltage and a termination impedance for the second means,
wherein the first reference voltage, the second reference voltage, the driver impedance and the termination impedance are selected from a set of pre-determined values, and
wherein the set of pre-determined values are associated with different signaling modes for communication of the first data and the second data; and
a comparator and a switching mechanism in the calibration circuit, wherein the comparator is coupled to a third reference voltage and selectively coupled to pre-determined voltages by the switching mechanism, and wherein, based on an output from the comparator, the control logic configures the switching mechanism to select the first reference voltage and the second reference voltage from the pre-determined voltages.

22. A circuit, comprising:
a transmit circuit coupled to an output node, wherein the transmit circuit is to transmit first data to a memory circuit through the output node;
a receive circuit coupled to a first input node, wherein the receive circuit is to receive second data from the memory circuit through the first input node;
a calibration circuit;
control logic coupled to the calibration circuit, wherein the calibration circuit and the control logic are to select a first reference voltage and a driver impedance for the transmit circuit and are to select a second reference voltage and a termination impedance for the receive circuit,
wherein the first reference voltage, the second reference voltage, the driver impedance and the termination impedance are selected from a set of pre-determined values, and
wherein the set of pre-determined values are associated with different signaling modes for communication of the first data and the second data; and
a comparator and a switching mechanism in the calibration circuit, wherein the comparator is coupled to a third reference voltage and selectively coupled to pre-determined voltages by the switching mechanism, and wherein, based on an output from the comparator, the control logic configures the switching mechanism to select the first reference voltage and the second reference voltage from the pre-determined voltages.

23. A non-transitory computer readable medium containing first data representing a circuit that includes:
a transmit circuit coupled to an output node, wherein the transmit circuit is to transmit second data to a memory circuit through the output node;
a receive circuit coupled to a first input node, wherein the receive circuit is to receive third data from the memory circuit through the first input node;
a calibration circuit;
control logic coupled to the calibration circuit, wherein the calibration circuit and the control logic are to select a first reference voltage and a driver impedance for the transmit circuit and are to select a second reference voltage and a termination impedance for the receive circuit,
wherein the first reference voltage, the second reference voltage, the driver impedance and the termination impedance are selected from a set of pre-determined values, and
wherein the set of pre-determined values are associated with different signaling modes for communication of the second data and the third data; and
a comparator and a switching mechanism in the calibration circuit, wherein the comparator is coupled to a third reference voltage and selectively coupled to pre-determined voltages by the switching mechanism, and wherein, based on an output from the comparator, the control logic configures the switching mechanism to select the first reference voltage and the second reference voltage from the pre-determined voltages.

24. A memory device, comprising:
a transmit circuit coupled to an output node, wherein the transmit circuit is to transmit first data to a memory controller through the output node;
a receive circuit coupled to a first input node, wherein the receive circuit is to receive second data from the memory controller through the first input node;
a calibration circuit;
control logic coupled to the calibration circuit, wherein the calibration circuit and the control logic are to select a first reference voltage and a driver impedance for the transmit circuit and are to select a second reference voltage and a termination impedance for the receive circuit,
wherein the first reference voltage, the second reference voltage, the driver impedance and the termination impedance are selected from a set of pre-determined values, and
wherein the set of pre-determined values are associated with different signaling modes for communication of the first data and the second data; and
a comparator and a switching mechanism in the calibration circuit, wherein the comparator is coupled to a third reference voltage and selectively coupled to pre-determined voltages by the switching mechanism, and wherein, based on an output from the comparator, the control logic configures the switching mechanism to select the first reference voltage and the second reference voltage from the pre-determined voltages.

25. A circuit, comprising:
a transmit circuit coupled to an output node, wherein the transmit circuit is to transmit first data to a memory controller through the output node;
a receive circuit coupled to a first input node, wherein the receive circuit is to receive second data from the memory controller through the input node;
a calibration circuit;
control logic coupled to the calibration circuit, wherein the calibration circuit and the control logic are to select a first reference voltage and a driver impedance for the transmit circuit and are to select a second reference voltage and a termination impedance for the receive circuit,
wherein the first reference voltage, the second reference voltage, the driver impedance and the termination impedance are selected from a set of pre-determined values, and
wherein the set of pre-determined values are associated with different signaling modes for communication of the first data and the second data; and
a comparator and a switching mechanism in the calibration circuit, wherein the comparator is coupled to a third reference voltage and selectively coupled to pre-determined voltages by the switching mechanism, and wherein, based on an output from the comparator, the control logic configures the switching mechanism to select the first reference voltage and the second reference voltage from the pre-determined voltages.

26. A non-transitory computer readable medium containing first data representing a circuit that includes:
a transmit circuit coupled to an output node, wherein the transmit circuit is to transmit second data to a memory controller through the output node;
a receive circuit coupled to a first input node, wherein the receive circuit is to receive third data from the memory controller through the first input node;
a calibration circuit;
control logic coupled to the calibration circuit, wherein the calibration circuit and the control logic are to select a first reference voltage and a driver impedance for the transmit circuit and are to select a second reference voltage and a termination impedance for the receive circuit,
wherein the first reference voltage, the second reference voltage, the driver impedance and the termination impedance are selected from a set of pre-determined values, and
wherein the set of pre-determined values are associated with different signaling modes for communication of the second data and the third data; and
a comparator and a switching mechanism in the calibration circuit, wherein the comparator is coupled to a third reference voltage and selectively coupled to pre-determined voltages by the switching mechanism, and wherein, based on an output from the comparator, the control logic configures the switching mechanism to select the first reference voltage and the second reference voltage from the pre-determined voltages.

27. A memory system, comprising a memory controller and a memory device coupled to the memory controller, wherein the memory controller includes:
a first transmit circuit coupled to a first output node, wherein the first transmit circuit is to transmit first data to the memory device through the first output node;
a first receive circuit coupled to a first input node, wherein the first receive circuit is to receive second data from the memory device through the first input node;
a first calibration circuit;
first control logic coupled to the first calibration circuit, wherein the first calibration circuit and the first control logic are to select a first reference voltage and a first driver impedance for the first transmit circuit and are to select a second reference voltage and a first termination impedance for the first receive circuit, wherein the first reference voltage, the second reference voltage, the first driver impedance and the first termination impedance are selected from a first set of pre-determined values, and wherein the first set of pre-determined values are associated with different signaling modes for communication of the first data and the second data; and a first comparator and a first switching mechanism in the first calibration circuit, wherein the first comparator is coupled to a third reference voltage and selectively coupled to pre-determined voltages by the first switching mechanism, and wherein, based on an output from the first comparator, the first control logic configures the first switching mechanism to select the first reference voltage and the second reference voltage from the pre-determined voltages.

28. The memory system of claim 27, wherein the memory device includes:

a second transmit circuit coupled to a second output node, wherein the second transmit circuit is to transmit the second data to the memory controller through the second output node;

a second receive circuit coupled to a second input node, wherein the second receive circuit is to receive the first data from the memory controller through the second input node;

a second calibration circuit;

second control logic coupled to the second calibration circuit, wherein the second calibration circuit and the second control logic are to select a fourth reference voltage and a second driver impedance for the second transmit circuit and are to select a fifth reference voltage and a second termination impedance for the second receive circuit, wherein the fourth reference voltage, the fifth reference voltage, the second driver impedance and the second termination impedance are selected from a second set of pre-determined values, and wherein the second set of pre-determined values are associated with the different signaling modes for communication of the first data and the second data; and a second comparator and a second switching mechanism in the second calibration circuit, wherein the second comparator is coupled to the third reference voltage and selectively coupled to pre-determined voltages by the second switching mechanism, and wherein, based on an output from the second comparator, the second control logic configures the second switching mechanism to select the fourth reference voltage and the fifth reference voltage from the pre-determined voltages.

29. A method for configuring an interface, comprising:

setting a first driver impedance for a first driver coupled to an input node so that the input node is approximately at a reference voltage, wherein the input node is coupled to a Thevenin equivalent circuit, and wherein the Thevenin equivalent circuit is characterized by an impedance and a voltage;

setting a second driver impedance for a second driver, wherein the second driver impedance approximately equals the first driver impedance;

setting a third driver impedance for a third driver so that an internal node between the second driver and the first driver is approximately at the reference voltage, wherein the second driver and the third driver are a complementary pair of drivers; and configuring a comparator to be coupled to a reference voltage and selectively coupled to pre-determined voltages in the interface, and using an output of the comparator to facilitate the setting operations.

* * * * *